(12) United States Patent
Mirow

(10) Patent No.: US 6,281,732 B1
(45) Date of Patent: Aug. 28, 2001

(54) PRECISION MULTIVIBRATOR USING STABILIZED AMPLIFIER SYSTEM

(76) Inventor: Fred Mirow, 118 Cornell Rd., Bala Cynwyd, PA (US) 19004

( * ) Notice: Subject to any disclaimer, the term of this patent is extended or adjusted under 35 U.S.C. 154(b) by 0 days.

(21) Appl. No.: 09/702,367

(22) Filed: Oct. 31, 2000

(51) Int. Cl.[7] ................................................. H03K 3/033
(52) U.S. Cl. ................................................ 327/227; 327/182
(58) Field of Search ..................................... 327/227–230, 327/172, 175, 182, 200, 291, 217

(56) References Cited

U.S. PATENT DOCUMENTS

| | | | | |
|---|---|---|---|---|
| 4,057,740 | * | 11/1977 | Arguello | 327/227 |
| 5,258,664 | * | 11/1993 | White | 327/94 |
| 5,592,128 | * | 1/1997 | Hwang | 327/135 |
| 5,841,306 | * | 11/1998 | Lim | 327/227 |
| 5,920,219 | * | 7/1999 | Young et al. | 327/227 |

* cited by examiner

Primary Examiner—Toan Tran

(57) ABSTRACT

The object of this invention are bistable, monostable and astable multivibrator in which the switching transition level is stable and relatively independent of ambient temperature. This reduction is accomplished by using an auto-zero amplifier system with an input offset voltage of substantially zero volts.

6 Claims, 6 Drawing Sheets

PRECISION MULTIVIBRATOR USING STABILIZED AMPLIFIER SYSTEM

BACKGROUND OF THE INVENTION

This invention relates to bistable, monostable and astable multivibrators in which the switching transition level is stable and relatively independent of ambient temperature. Applications for stable multivibrator are in but not limited to the fields of analog to digital converters, pulse generators, and oscillators.

BACKGROUND ART

One of the problems associated with multivibrators is that the switching transition level is very sensitive to changes in ambient temperature and power supply voltage. This change causes the multivibrator to have variations in the pulse duration time or oscillation frequency. To reduce this instability some form of compensation is necessary. One of the methods used is to use a FET as a resister to control the charging time of a capacitor. The FET resistance value is controlled by a temperature dependent voltage, which varies to maintain a constant capacitor charging time. This is described in U.S. Pat. No. 4,547,749 issued to Clinton Kuo. Another method is to use a constant current source circuit, which is designed to be temperature independent, to charge and discharge a timing capacitor. This is described in U.S. Pat. No. 4,714,901 issued to Jain et al.

In these methods the variation in pulse duration time or oscillator frequency has been reduced by controlling the charging time of capacitors, but nothing has been done to correct an other large error source, the sensitivity of the amplifier input offset voltage to temperature and supply voltage change.

SUMMARY OF THE INVENTION

The object of this invention are bistable, monostable and astable multivibrators in which the pulse duration or frequency stability, respectively is increased by reducing the change in the amplifier input offset voltage due to variations in operating temperature, power supply voltage and component parameter variations. This maintains a stable switching transition level. This reduction is accomplished by using an auto-zero amplifier system to reduce and maintain the amplifier input offset voltage at substantially zero volts. The auto-zero system operates continuously as the multivibrator also generates an output signal. This allows the multivibrator to maintain high stability even as power supply voltage level and operating temperature change.

A multivibrator can be described by dividing it into two sections, the amplifier, and voltage reference. The amplifier compares the voltage level applied to one of its input terminals to that of the voltage reference applied to its other input terminal. The amplifiers output signal state is either high or low depending on the polarity of the voltage level difference between the two input terminals. The switching transition level is the voltage level difference between the two input terminals at which the amplifiers output signal state changes. Monostable and astable multivibrator have an additional section the timing network which sets the length of the pulse duration or oscillation frequency by providing a fixed time period to charge or discharge a capacitor to a voltage reference level. When the voltage level of timing network reaches that of the voltage reference, the amplifier's output signal causes the timing circuit to be either charged or discharged. Ideally the amplifier determines exactly when the voltage level of timing network or external signal applied to its input becomes higher or lower than that of the reference voltage applied to its other input. In multivibrators using high quality passive components (capacitors, resistors, etc.) in the timing network, the amplifier section has the greater parameter variation with supply voltage and temperature. The amplifier's transistor parameters change cause the amplifier offset voltage to change, which in turn changes the pulse duration or frequency of oscillation. This change in pulse duration or oscillator frequency can be reduced by adjusting the input offset voltage of the amplifier to substantially zero volts during a portion of the time period when the amplifier's function is not necessary for the multivibrator to function. This occurs during a fraction of the time period after which the multivibrator changes state. By maintaining the amplifier input offset voltage constant at substantially zero volts, the pulse duration or oscillator frequency stability is increased.

BRIEF DESCRIPTION OF THE DRAWINGS

The invention will be described in detail hereinafter with reference to the accompanying drawings; in which.

DETAILED DESCRIPTION OF THE INVENTION

Figure 1:
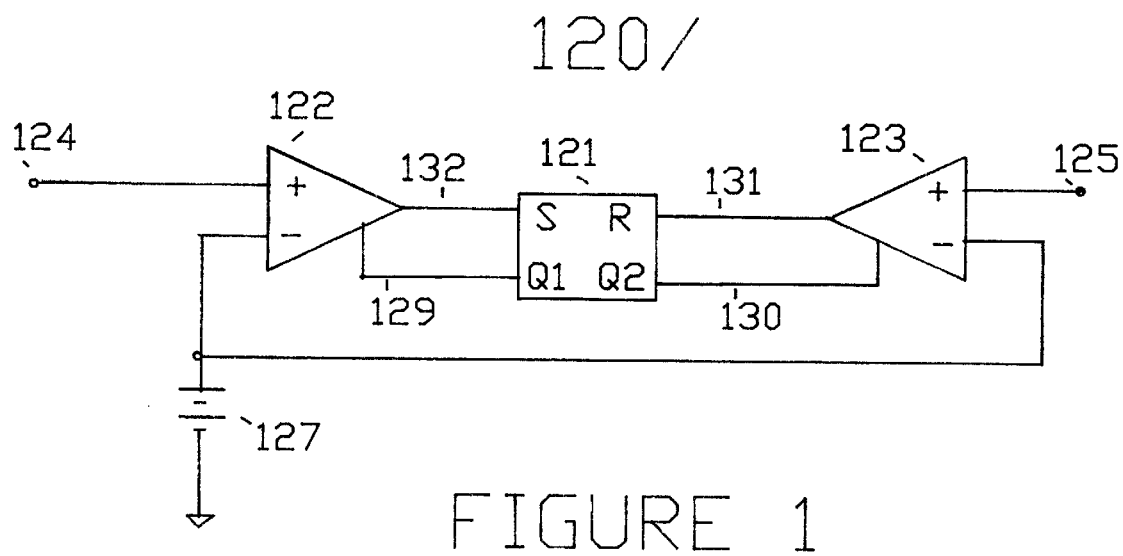
FIG. 1 is a schematic representation of a bistable multivibrator 120.

Shown in FIG. 1 is a bistable multivibrator 120 that exist in either of two stable states and which can be induced to make an abrupt transition from on state to the other by means of external excitation. The bistable multivibrator 120 without the feedback 129 and 130, is well known by those skilled in the art and has numerous other names such as flip-flop and trigger circuit.

The bistable multivibrator 120 has two differential input amplifiers 122 and 123 that maintain their input offset voltages at substantially zero volts. This is accomplished by using auto-zero methods which are well known by those skilled in the art and have various approaches such as chopper stabilized, Owen-Prinz, and etc. Terminal 124 and voltage reference 127 are connected to the input of amplifier 122. When the voltage level at terminal 124 at time A (FIG. 2) increases above the voltage reference 127 level, amplifier 122 output signal which is connected to the set input of R S Flip-Flop 121 by line 132 goes to a high signal level. This causes the Q1 output on line 129 of R S Flip-Flop 121 to go to a high signal level and the Q2 output signal level to go low. The voltage level at terminal 124 no longer has any effect on the state of R S Flip-Flop 121. R S flip-flop 121 is also referred to well known by those skilled in the art as a latch. At time B (FIG. 2) voltage level at terminal 124 decreases below that of voltage reference 127 and R S Flip-Flop 121 remains in its new stable state until a sufficient voltage level is applied to terminal 125. Terminal 125 and voltage reference 127 are connected to the input of amplifier 123. At time C (FIG. 2) the voltage level applied to terminal 125 increases above the voltage level of voltage reference 127, amplifier 123 output signal which is connected to the reset input of R S flip-flop 121 by line 131 goes to a high signal level. This causes the Q2 output on line 130 of R S flip-flop 121 to go to a high signal level and the Q1 output signal level to go low. The voltage level at terminal 125 no longer has any effect on the state of R S flip-flop 121. At time D (FIG. 2) voltage level at terminal 125 decreases below that of voltage reference 127 and R S flip-flop 121 remains in its new stable state until a sufficient signal level is again applied to terminal 124.

The signal at output Q2 is applied to the control input of amplifier 123. The high signal level at Q2 on line 130 causes amplifier 123 to enter null mode. When Q2 has a low signal level amplifier 123 is in the amplify mode. The signal at Q1 output is applied to the control input of amplifier 122. The high signal level at Q1 on line 129 causes amplifier 122 to enter null mode. When Q1 has a low signal level amplifier 122 is in the amplify mode.

Figure 3:
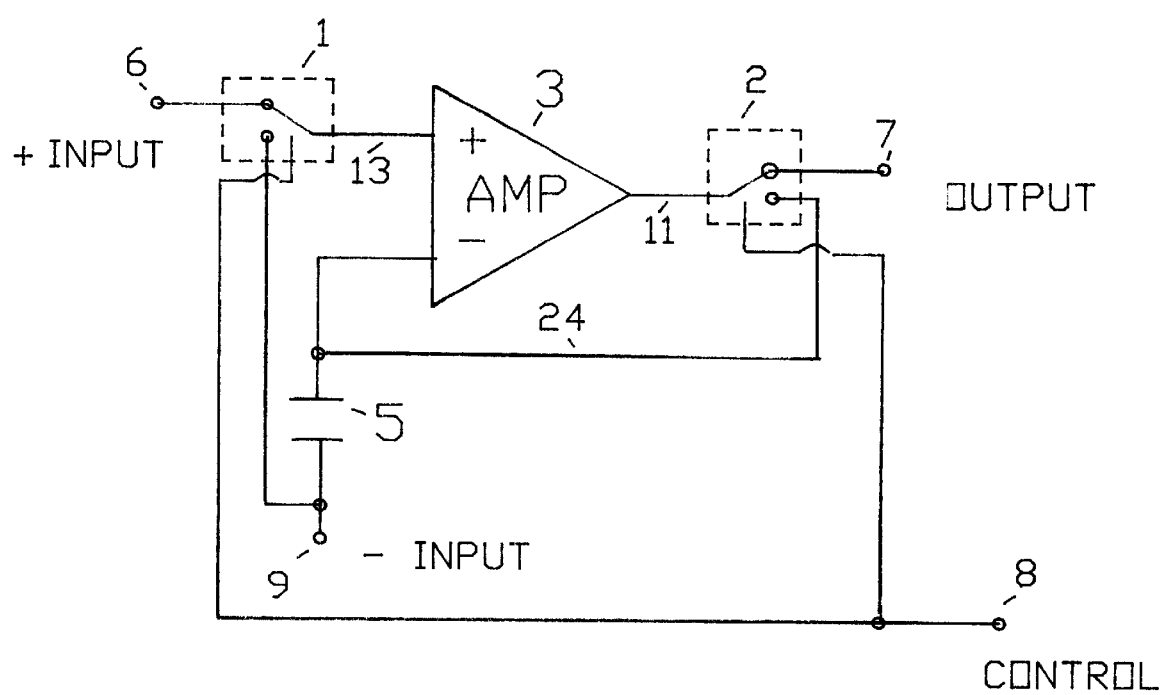
FIG. 3 is a schematic representation of an auto-zero amplifier system 10.

Amplifiers 122 and 123 consist of auto-zero amplifier system 10 of FIG. 3 which has two modes of operation, amplify and null. When relays 1 and 2 are activated by a high-level signal applied to control terminal 8, auto-zero amplifier system 10 is operating in the null mode. During the null mode auto-zero amplifier system 10 has its input offset voltage stored in capacitor 5. This is accomplished by connecting amplifier 3 output line 11 to inverting input signal line 24 and non-inverting input signal line 13 to inverting input terminal 9. The signal output from amplifier 3 is now substantially equal to its input offset voltage. Capacitor 5 is connected to line 24 and also inverting input terminal 9. A voltage substantially equal to the input offset voltage is now stored in capacitor 5. The auto-zero amplifier system 10 is-now returned to the amplify mode by applying a low-level signal to control terminal 8. Relay 1 connects the noninverting amplifier input line 13 to signal input terminal 6 and relay 2 connects amplifier output line 11 to signal output terminal 7. The combined voltage levels of voltage inverting input terminal 9 and Capacitor 5 set the threshold level at which amplifier 3 output transitions occur. In this mode the voltage stored in capacitor 5 now varies amplifier 3 threshold level in a direction that substantially cancels the effect of the input offset voltage. In this manner the output is restored to the level that it would have if the amplifier 3 had substantially zero input offset voltage. In the amplify mode capacitor 5 sees an substantial infinite resistance presented by the inverting amplifier input on line 4, and thus holds its charge. In the amplify mode the voltage level between input terminal 6 and inverting input terminal 9 is amplified with the input offset voltage of amplifier system 10 reduced to substantially zero.

Figure 2:
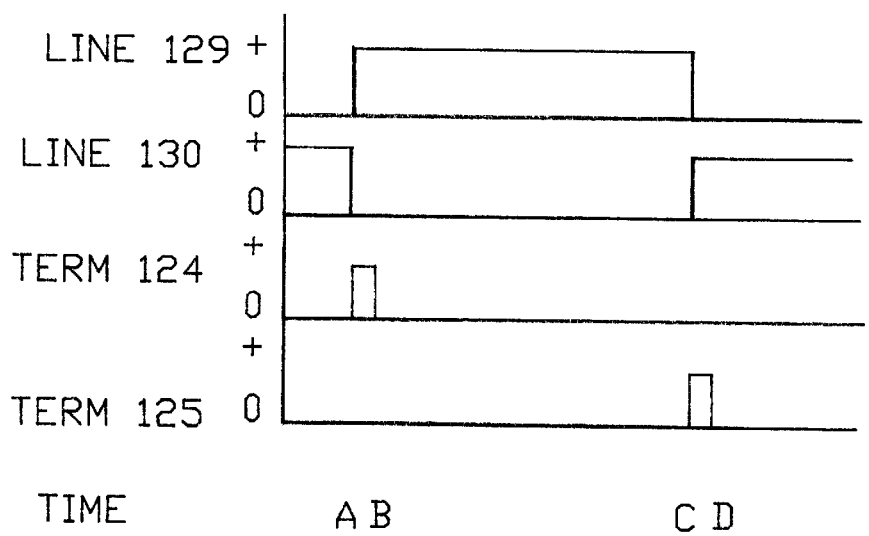
FIG. 2 is a timing diagram of bistable multivibrator 120.
Figure 4:
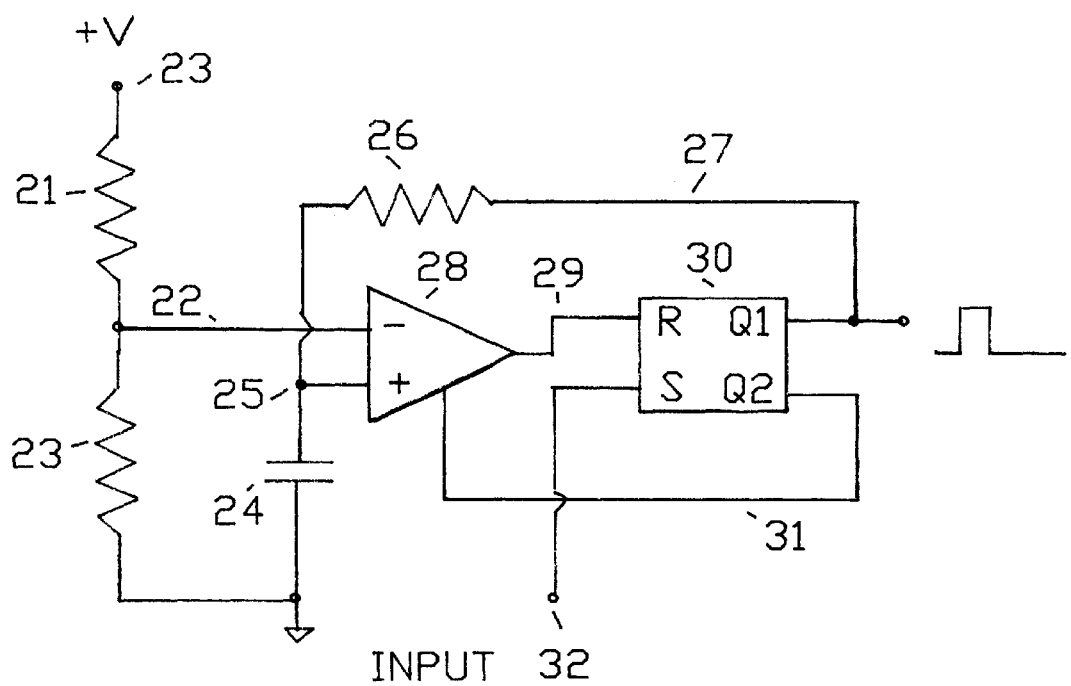
FIG. 4 is a schematic representation of a monostable multivibrator 20.
Figure 5:
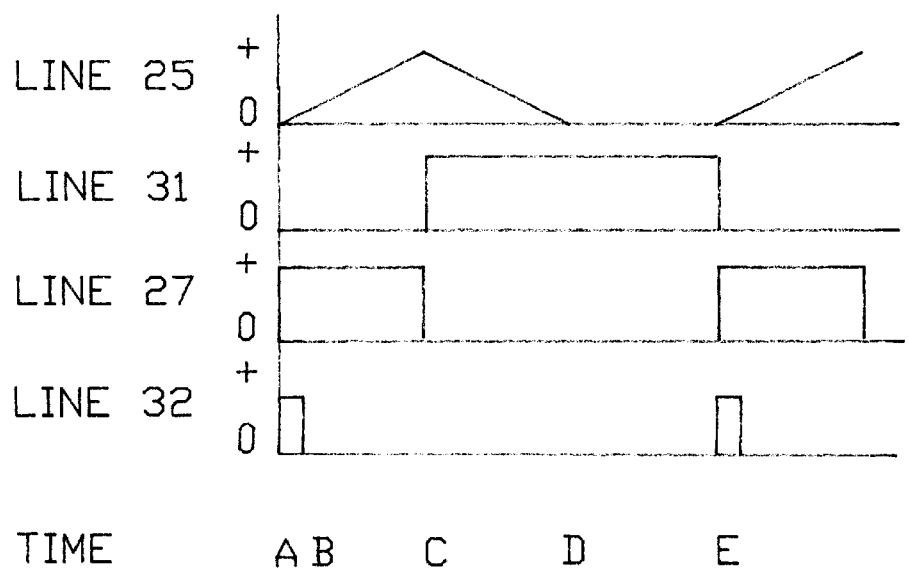
FIG. 5 is a timing diagram of monostable multivibrator 20.

Shown in FIG. 4 is a monostable multivibrator 20 that produces an constant time duration output pulse after being triggered by a narrow pulse applied to its input. The monostable multivibrator 20 without the feedback 31 is well known by those skilled in the art. It uses an auto-zero amplifier system 28, which maintains the input offset voltage at substantially zero volts. The output signal of Amplifier 28 is connected to the reset input of R S flip-flop 30 by line 29. The timing network consists of capacitor 24 and resistor 26. The rate of charge or discharge is determined by the value of resistor 26 and capacitor 24. When a high level pulse is applied to input terminal 32 at time A (FIG. 5) the Q1 output of R S flip-flop 30 goes high to a voltage level substantially equal to the DC voltage applied to terminal 23. At time B (FIG. 5) the high level pulse applied to input terminal 32 is removed. Capacitor 24 is charged through resistor 26. The voltage level on line 25 increases to the level on line 22. The voltage level on line 22 is set by the voltage reference consisting of voltage divider resistors 21 and 23 and the DC input voltage applied to terminal 23. When the voltage level on line 25 exceeds that of line 22 at time C (FIG. 5) the output signal of amplifier 28 on line 29 goes high and resets R S flip-flop 30 Q1 output on line 27 low and output Q2 on line 31 high. The signal at Q2 is high when that of Q1 is low and vice a versa. The low signal voltage level is substantially equal to zero volts. When Q1 output is low capacitor 24 is discharged through resistor 26 and the circuit returns to its initial condition at time D (FIG. 5). The circuit remains in this state until the next high level pulse is again applied to input terminal 32 at time E (FIG. 2). The signal at output Q2 is applied to the control input of amplifier 28. The high signal level at Q2 on line 32 causes amplifier 28 to enter null mode. When Q2 is low amplifier 28 is in the amplify mode.

Figure 6:
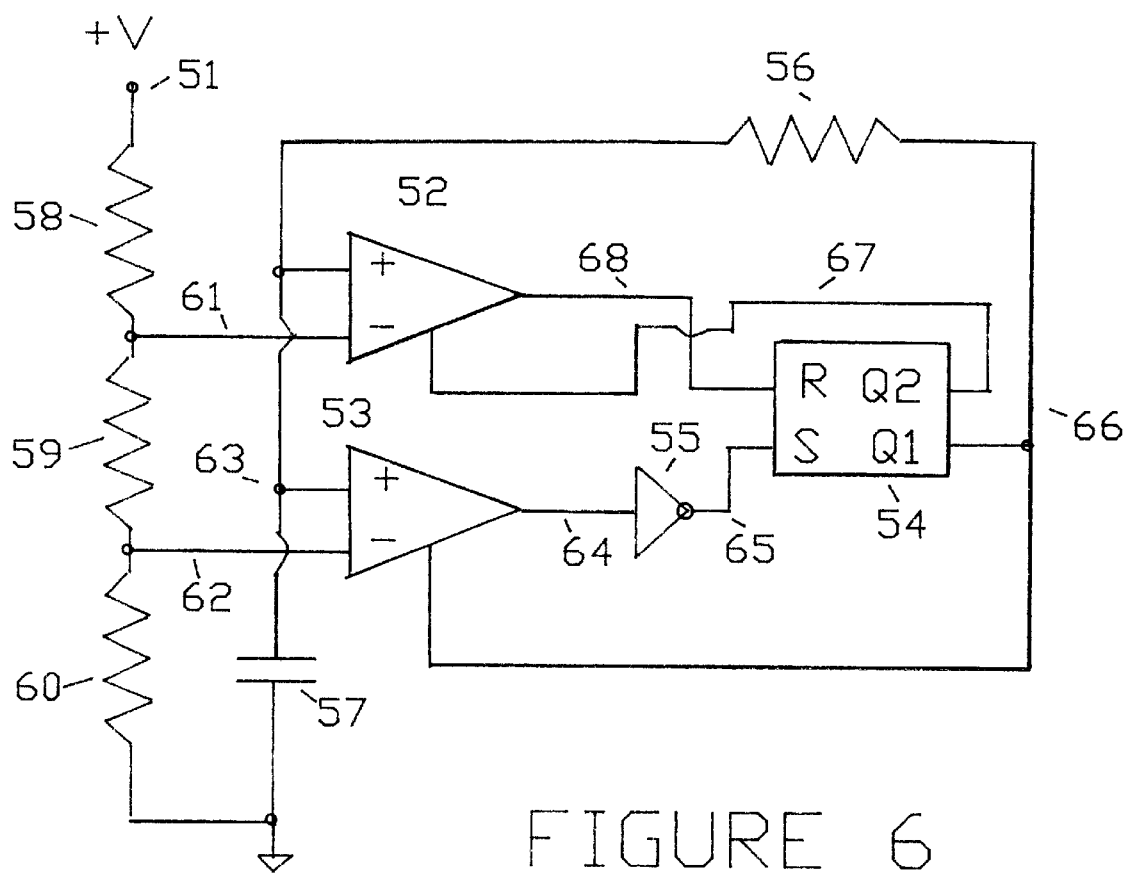
FIG. 6 is a schematic representation of an astable multivibrator 50.
Figure 7:
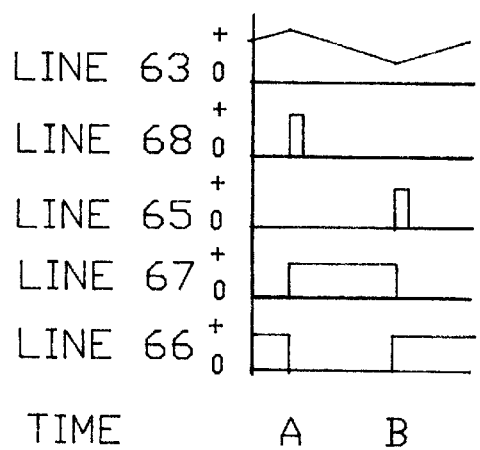
FIG. 7 is a timing diagram of astable multivibrator 50.

Shown in FIG. 6 is an astable multivibrator 50. The astable multivibrator without the feedback 66 and 76 is well known by those skilled in the art. Two auto-zero amplifier systems 52 and 53 are used. Amplifier 52 may be identical to amplifier 53. The amplifiers 52 and 53 maintain the their input offset voltage at substantially zero volts. The output signal of Amplifier 52 on line 68 is connected to the reset input of R S Flip-Flop 54. The output signal of Amplifier 53 is connected to the input of inverter 55. Inverter 55 has a high output on line 65 when line 64 is low and a low output when its input is high. Line 65 connects the output of inverter 55 to the set input of R S Flip-Flop 54. The timing network consists of capacitor 57 and resistor 56. The rate of charge or discharge is determined by the value of resistor 56 and capacitor 57. Capacitor 57 is charged through resistor 56 when the Q1 output of R S Flip-Flop 12 is high on line 66. The outputs signal levels of Q1 and Q2 of R S Flip-Flop 54 are substantially equal to the DC voltage level applied to terminal 51 when high and when low substantially equal to zero volts. The voltage reference consists of resistors, 58, 59, and 60 which produces voltage levels on lines 61 and 62 prortional to the DC volta applied to terminal 51. The voltage level on line 62 is less than that on line 61. When the voltage level on line 63 exceeds the level on line 61 at time A (FIG. 7), the output signal of amplifier 52 goes high causing the Q1 output of R S Flip-Flop 54 to go low and output Q2 on line 67 to go high. The signal at Q2 is high when that of Q1 is low and vice a versa. When Q1 output is low capacitor 57 is discharged through resistor 56. The signal at output Q2 is applied to the control input of amplifier 52. The high signal level at Q2 on line 67 causes amplifier 52 to null. Amplifier 53 is now in the amplify mode since Q1 is now low. When the voltage level on line 63 decreases below the level on line 62 at time B (FIG. 7), the output signal of amplifier 53 on line 64 goes low which causes inverter 55 output on line 65 to go high. This causes the Q1 output of R S Flip-Flop 54 to go high and Q2 to go low. Capacitor 57 is charged through resistor 56 and amplifier 53 is placed in null mode while amplifier 52 is now again in the amplifying mode.

Figure 8:
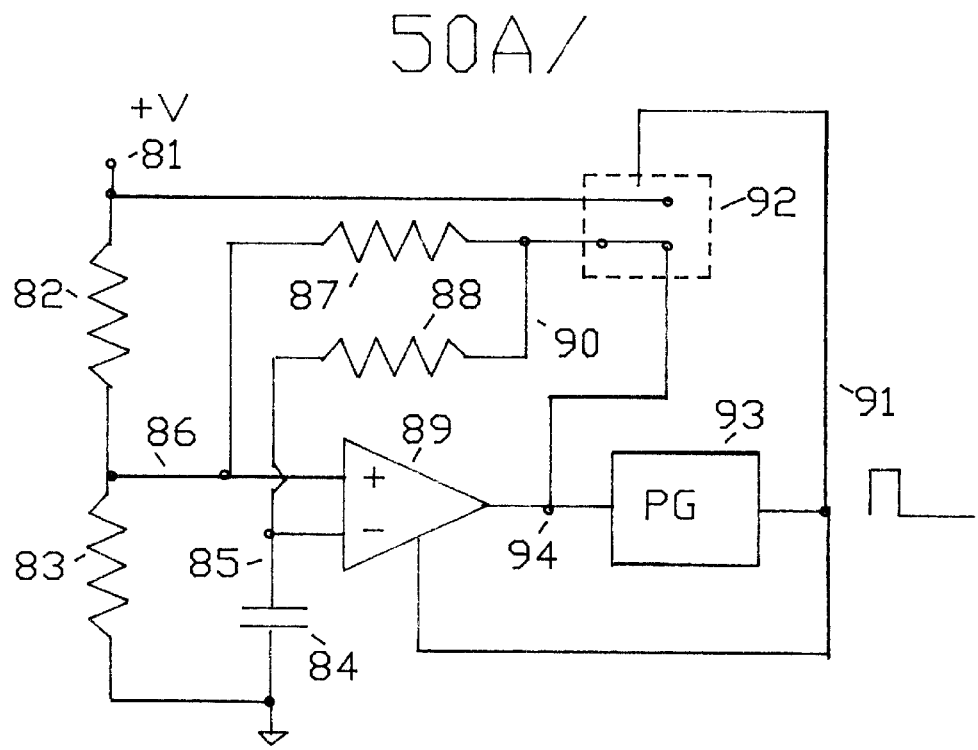
FIG. 8 is a schematic representation of an ernate embodiment of astable multivibrator 50A.
Figure 9:
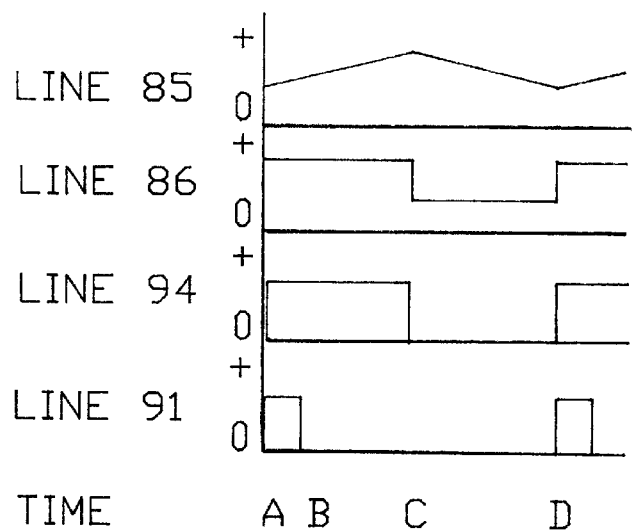
FIG. 9 is a timing diagram of astable multivibrator 50A.
Figure 10:
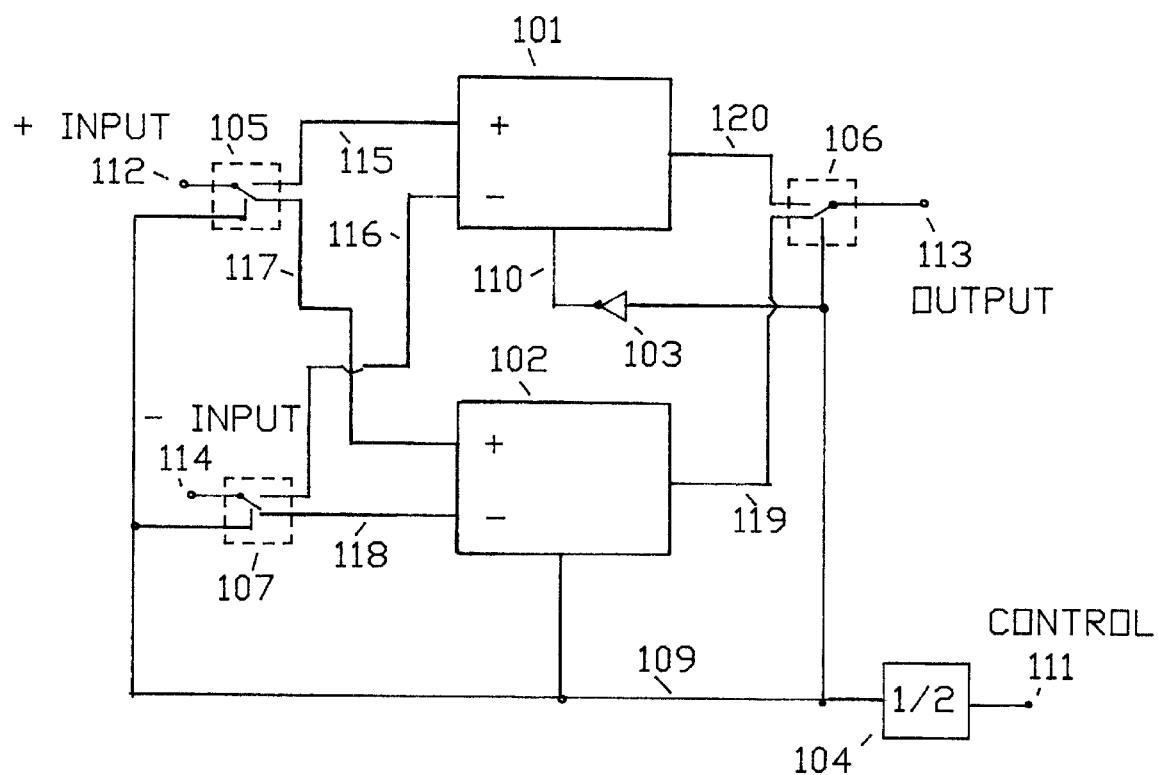
FIG. 10 is a schematic representation of a multiple amplifier system 100.

Shown in FIG. 8 is an other astable multivibrator 50A. Auto-zero amplifier systems 89 maintains its input offset voltage at substantially zero volts by using auto-zero methods. The output signal of Amplifier 89 is connected to the input of pulse generator 93. When Amplifier 89 output on line 94 goes high at time A (FIG. 9) the output signal of pulse generator 93 on line 91 goes high for a fixed time duration. The high signal on line 91 turns on relay 92 and is also connected to Amplifier 89 control input, causing Amplifier 89 to enter the null mode. Relay 92 now connects line 90 to the DC voltage applied to terminal 81. The timing network consists of capacitor 84 and resistor 88. The rate of charge and discharge is determined by the value of resistor 88 and capacitor 84. Capacitor 84 is charged through resistor 88 towards the voltage level on line 86. At the end of pulse generator 93 fixed time duration at time B (FIG. 9) its output goes low returning Amplifier 89 to the amplify mode and turning off relays 92. Pulse generator 93 does not need high accuracy since changes in its pulse duration do not effect the multivibrator oscillating frequency. The pulse duration needs to be longer then amplifier 89 null time and shorter then time C (FIG. 9). Relay 92 now connects line 90 to Amplifier 89 output on line 94 which has a high signal level substantially equal to the DC voltage applied to terminal 81 and capacitor 84 continues to charge. When the voltage level on line 85 exceeds the level on line 86 at time C (FIG. 9), the output signal of amplifier 89 goes low, substantially zero volts, and capacitor 84 is discharged through resistor 88. When the voltage level on line 85 decreases below the level on line 86 at time D (FIG. 9), the output signal of amplifier 89 goes high and triggers pulse generator 93 again repeating the cycle of operation.

The voltage reference consist of resistors 82, 83 and 87 which form a voltage divider to produce a voltage on line 86. The voltage input is the DC voltage applied to terminal 81 and also the voltage level on line 90. The voltage level on line 86 is at a higher level during the time capacitor 84 is charging then when capacitor 84 is discharging as shown in FIG. 9.

An approach to using the auto-zero method at frequencies higher then at which auto-zero amplifier system 10 has adequate null time is to use multiple amplifier system 100. Multiple amplifier system 100 uses two auto-zero amplifier system 10, amplifiers 101 and 102. Each of the amplifier systems are alternately connected or disconnected to multiple amplifier system 100 input terminals 112 and 114 and output terminal 113. The connected amplifier either 101 or 102 is always in the amplify mode and disconnected amplifier is in null mode. The interchanging of the amplifiers occurs at a submultible of the oscillator frequency and at the time when the control signal goes high for the amplifier system 10 that it is replacing. Divider 104 input is connected to control input 111 and its output is connected to line 109. Divider 104 performs a divide by two function with its input signal frequency being twice that of its output signal frequency. When line 109 is high amplifier 102 is in the null mode while the output signal of inverter 103 on line 110 is low putting amplifier 101 in the amplify mode. In addition relays 105, 106, and 107 now connects amplifier 101 and disconnects amplifier 102 from the multiple amplifier's corresponding input terminals noniverting 112 and inverting 114 and output terminal 113. When a low signal level is applied to control line 109, amplifier 102 is in the amplify mode while the output signal of inverter 103 is high, putting amplifier 101 in the null mode. Amplifier 102 is now connected to the multiple amplifier system 100 corresponding input terminals, noniverting 112 and inverting 114 and output terminal 113. This approach can be expanded by adding additional relays to substitute for additional amplifiers, as they are one at a time placed in null mode.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the claims.

I claim:

1. A precision, bistable multivibrator responsive to an trigger input pulse, said multivibrator comprising:

means for providing a reference voltage;

an auto-zero amplifier system having input pair which is responsive to the trigger input pulse and the reference voltage;

latch means which is set by said amplifier and which provides an output level indication; said amplifier set to an amplify or null mode responsive to said latch;

said amplifier being connected to said latch to change said latch;

state when the difference between said trigger voltage and said reference voltage polarity changes, whereby triggering of the multivibrator output is a stable function of the difference between said trigger voltage and said reference voltage.

2. A precision, monostable multivibrator responsive to an initiating trigger pulse, said multivibrator comprising:

timing means for providing a voltage that is responsive to time;

means for providing a reference voltage;

a latch means which is set by said trigger pulse and which provides an output level indication;

an auto-zero amplifier system set to an amplify or null mode responsive to said latch;

said amplifier having further input pair which is responsive to said timing means and said reference voltage;

said amplifier being connected to said latch for changing said latch's state when the difference between said timing means voltage and said reference voltage polarity changes, whereby timing of the one-shot output is a stable function of the difference between said timing means voltage and said reference voltage.

3. A precision, monostable multivibrator responsive to an initiating trigger pulse, said multivibrator comprising:

timing components including a capacitor one side of which can be charged and discharged and the other side which is maintained at a fixed potential and means for discharging said capacitor; means for providing a reference voltage;

a latch circuit which is set by said trigger pulse and which provides an output level indication;

an auto-zero amplifier system set to an amplify or null mode responsive to said latch;

said amplifier having further input pair which is responsive to the said capacitor voltage and said reference voltage;

means responsive to said latch for charging said one side of said capacitor;

said amplifier being connected to said latch for resetting said latch when the difference between said capacitor voltage and said reference voltage polarity changes, whereby timing of the one shot output is a stable function of the difference between said capacitor voltage and said reference voltage.

4. A precision, astable multivibrator, said multivibrator comprising:

timing means for providing a voltage that is responsive to time;

means for providing a reference voltage;

latch means for controlling said timing means and which provides an output level indication;

an auto-zero amplifier system set to an amplify or null mode responsive to said latch;

said amplifier having further input pair which is responsive to said timing means and said reference voltage;

said amplifier being connected to said latch for changing said latch's state when the difference between said timing means voltage and said reference voltage polarity changes, whereby timing of the astable multivibrator output is a stable function of the difference between said timing means voltage and said reference voltage.

5. A precision, astable multivibrator, said multivibrator comprising:

timing components including a capacitor one side of which can be charged and discharged and the other side which is maintained at a fixed potential;

an auto-zero amplifier system providing a pair of inputs, which is responsive to the voltage on said one side of said capacitor and the reference voltage;

a latch means which is set by said amplifier output and which provides an output level indication;

means for selectively charging or discharging said one side of said capacitor responsive to said latch;

said amplifier system set to an amplify or null mode responsive to said latch;

means for providing a reference voltage as one input to said amplifier;

means for applying the voltage on said capacitor as the other input to said amplifier, said amplifier being connected to said latch for changing said latch's state when the difference between said capacitor voltage and said reference voltage polarity changes, whereby timing of the multivibrator output is a stable function of the difference between said capacitor voltage and said reference voltage.

6. A multivibrator as claimed in claim 4, wherein the amplifier system comprises:

multiple amplifiers;

the output from the latch being applied to divider means; means to alternately connect one of said amplifiers and disconnect the other one of said amplifiers from the timing means and the reference voltage in response to said divider means;

said connected amplifier is in the amplify mode;

said disconnected amplifier is in the mull mode;

said divider means maintaining said amplifier in the amplify or null mode for time duration longer than time duration of the latch output signal allowing the multivibrator to operate at higher frequency than said amplifier.

* * * * *